US005910990A

United States Patent [19]

Jang

[11] Patent Number: 5,910,990

[45] Date of Patent: Jun. 8, 1999

[54] APPARATUS AND METHOD FOR AUTOMATIC EQUALIZATION OF PERSONAL MULTI-CHANNEL AUDIO SYSTEM

[75] Inventor: Dae-Young Jang, Daejeon, Rep. of Korea

[73] Assignees: Electronics and Telecommunications Research Institute, Daejeon; Korea Telecom, Seoul, both of Rep. of Korea

[21] Appl. No.: 08/874,214

[22] Filed: Jun. 13, 1997

[30] Foreign Application Priority Data

Nov. 20, 1996 [KR] Rep. of Korea ...................... 96-55696

[51] Int. Cl.[6] ................................ H04R 5/00; H03G 5/00

[52] U.S. Cl. ................................. 381/1; 381/17; 381/103

[58] Field of Search .................................... 381/1, 17, 18, 381/19, 26, 74, 119, 103, 309, 310, 311, FOR 126

[56] References Cited

U.S. PATENT DOCUMENTS

| | | | |
|---|---|---|---|
| 3,962,543 | 6/1976 | Blauert et al. | 381/310 |
| 5,034,983 | 7/1991 | Cooper et al. | 381/74 |
| 5,173,944 | 12/1992 | Begault | 381/17 |
| 5,181,248 | 1/1993 | Inanaga et al. | 381/74 |
| 5,208,860 | 5/1993 | Lowe et al. | 381/17 |
| 5,333,200 | 7/1994 | Cooper et al. | 381/1 |
| 5,371,799 | 12/1994 | Lowe et al. | 381/74 |
| 5,386,082 | 1/1995 | Higashi | 381/17 |
| 5,420,929 | 5/1995 | Geddes et al. | 381/1 |
| 5,438,623 | 8/1995 | Begault | 381/17 |
| 5,452,359 | 9/1995 | Inanaga et al. | 381/74 |
| 5,684,881 | 11/1997 | Serikawa et al. | 381/1 |
| 5,696,831 | 12/1997 | Inanaga et al. | 281/74 |
| 5,715,318 | 2/1998 | Hill et al. | 381/17 |
| 5,729,612 | 3/1998 | Abel et al. | 381/1 |
| 5,796,843 | 8/1998 | Inanaga et al. | 381/309 |

*Primary Examiner*—Forester W. Isen
*Assistant Examiner*—Xu Mei
*Attorney, Agent, or Firm*—Cohen, Pontani, Lieberman & Pavane

[57] ABSTRACT

An apparatus for automatically equalizing a personal multi-channel audio system, and a method therefor, are disclosed. White noises which are generated by a transfer characteristic measuring section are reproduced through speakers. Transfer signals from the respective speakers are collected through a microphone array at a listening position so as to transmit the collected signals to a transfer function calculating section. The transfer function calculating section calculates the transfer characteristics between the respective speakers and the listening position by utilizing the white noise and the collected signals. Then the sound characteristics of the respective sound channels are adjusted so that the transfer characteristics between the respective speakers and the listening position would be equalized. Further, phantom channels are synthesized and reproduced by utilizing the transfer functions and the installed speakers. Therefore, at the given environment, an optimum sound reproduction is obtained. Further, a small number of speakers can give an effect of a large number of speakers through the synthesis of phantom channels. In the case of an A/V system, the sound reproduction range can be adjusted in accordance with the size of the screen.

5 Claims, 3 Drawing Sheets

APPARATUS AND METHOD FOR AUTOMATIC EQUALIZATION OF PERSONAL MULTI-CHANNEL AUDIO SYSTEM

BACKGROUND OF THE INVENTION

1. Field of the Invention

The present invention relates to an apparatus for automatically equalizing a personal multi-channel audio system, and a method therefor. In particular, the present invention relates to an apparatus for automatically adjusting an audio reproducing characteristics, in which various parameters of a high fidelity personal or home using audio system are measured, and based on the measurement, the reproduction characteristics are corrected, and a phantom channel is formed, thereby automatically equalizing the reproduction environment.

2. Description of the Preferred Embodiment

Generally, the current audio systems adjust the sound volume and the balance.

In the conventional audio systems, the difficulties encountered in the manual sound balance adjustment are overcome in such a manner, that the sound balance is automatically adjusted by adjusting volume and delays using the sound detected at the listening position, and that the sound balance, bass and treble are adjusted by proper selections on the part of the user in between two predetermined limits pausing at each intermediate value.

Further, the currently used personal and home using audio systems are fixed to predetermined reproduction characteristics. That is, they imitates the reproduction atmosphere of theaters and public performance rooms. However, if a good listening environment is not provided, the audio system cannot give a good result. That is, in the case of a stereo sound, if the listening position and the two speakers do not form an equilateral triangle, then the sounds lean to one speaker, with the result that the stereo characteristics are degraded. Further, in accordance with the listening environment, the characteristics of the reproduced sounds are varied, and therefore, the optimum sound cannot be enjoyed.

There are audio systems in which the left and right sound volumes and the delays can be automatically adjusted, but in a multi-channel system, an optimum listening cannot be obtained only by adjusting the sound balance. Particularly, recently, demands for high quality audio and A/V (home theater) systems are increasing. Further, in order to give a more real sensation, the sounds of movies and videos are supplied not only in the left and right form, but also in a front and rear form. Accordingly, the listening environments for the multi-channel audio systems are greatly diversified, and therefore, it is difficult to place the speakers at proper positions. Therefore it is impossible to obtain an ideal listening, and it aggravates economy to modify the listening room based on the audio system.

SUMMARY OF THE INVENTION

The present invention is intended to overcome the above described disadvantages of the conventional techniques.

Therefore it is an object of the present invention to provide an apparatus for automatically equalizing a personal multi-channel audio system, and a method therefor, in which the multi-channel sounds are received as an input, and the listening environment is measured and the reproduction characteristics are corrected in accordance with the positions of the speakers and the characteristics of the listening environment, thereby reproducing the optimum sounds at the given environment.

It is another object of the present invention to provide an apparatus for automatically equalizing a personal multi-channel audio system, and a method therefor, in which an effect of many speakers is obtained with a small number of speakers by phantom channels, and in the case of an A/V system, the sound reproduction range can be adjusted in accordance with the size and position of picture.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE INVENTION

Figure 1:
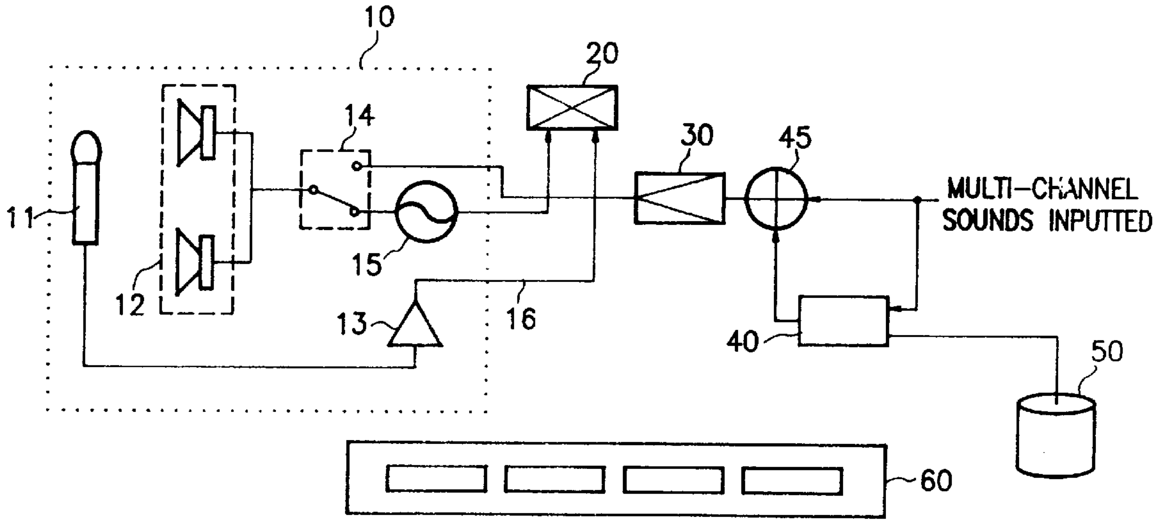
FIG. 1 is a block diagram showing the overall constitution of the apparatus for automatically adjusting a multi-channel audio system according to the present invention.

FIG. 1 is a block diagram showing the overall constitution of the apparatus for automatically adjusting a multi-channel audio system according to the present invention.

Referring to FIG. 1, a transfer characteristic measuring section 10 converts digital white noises to analogue signals to sequentially reproduce them through speakers 12, and collects signals of a microphone 11 through a buffer 13. Under this condition, transfer signals 16 thus collected are transmitted to a transfer function calculating section 20 so that the transfer characteristics can be calculated.

A white noise generating section 15 is connected to the speakers 12 only during the initializing period, and then, is connected to audio output signals after the completion of the initialization. For this purpose, a switching function 14 is required. The white noise of the respective speakers 12 are generated in the order of the frontal left side, the frontal right side, the central portion, the rear left side and the rear right side. Under this condition, the channel in which a speaker is not connected does not have to be measured by carrying out an inputting by the user connecting section 60 in advance.

The transfer function calculating section 20 calculates the transfer characteristics between the respective speakers and the listening position, i.e., the frequency characteristics, the delay time, the distance and the directions by utilizing the white noise signals and the transfer signals which have been transmitted from the transfer characteristic measuring section 10. The calculation of the transfer characteristics includes the calculation of the reference positions of the respective speakers, and the calculation of inverse characteristics between the transfer characteristics of the real speakers. Through these calculations, the characteristics of the respective speakers at the listening position become same as the characteristics at the reference position. These calculated transfer characteristics are used in adjusting the filter coefficient of a reproduction characteristic correcting section 30. The actual positions of the respective speakers are calculated based on the signal arrival time difference between the microphones.

The reproduction characteristic correcting section 30 corrects the sound reproduction characteristics by forming filters in accordance with the reproduction characteristics which have been calculated by the transfer function calculating section 20. Thus the section 30 receives the general sounds, and the output which has passed through the filter is outputted through the speakers 12. Under this condition, the transfer characteristics at the listening position becomes same as the characteristics at the reference position. If the corrected characteristics do not meet the tolerance range, a remeasurement is carried out, or the remeasurement is repeated until a satisfactory result is obtained.

Further, once set up, the filter coefficient is stored into a memory, so that it can be used next time. For this part, the greater the length of the filter coefficient, the better the result.

A phantom channel synthesizing section 40 synthesizes the sounds outside the range of the outputs of the speakers which are connected to the audio system. It synthesizes inputted sounds into signals of arbitrary directions by utilizing an audio characteristic data base (DB) 50. The synthesized phantom channel is reproduced mainly by the speakers of the frontal channel. Even in the case where only two speakers of the frontal channel are connected, the signals of the upper rear channel are formed into a phantom channel in reproducing them, and thus, a desired 3-dimensional sound can be obtained.

The audio characteristic DB 50 is a space for storing the sound characteristics of the basic speaker layout. That is, it stores the characteristics of frontal left/right sides, the central portion, the rear left/right sides and the upper side. The stored characteristics are used when an inverse filter is formed by the transfer function calculating section 20, and when the phantom channels are synthesized by the phantom channel synthesizing section 40.

The user interface section 60 decides whether an automatic adjustment for the audio system should be carried out or not. Further, the section 60 is used when the size of the video media is inputted. The user interface section 60 includes a plurality of switches which are capable of inputting a plurality of data, while the inputted data control the operations of the respective sections. Further, the user interface section 60 displays the current system status and other necessary information in such a manner that they could be easily recognized.

The automatic adjusting apparatus for the high fidelity personal or home use audio system according to the present invention is constituted and operates in the following manner.

The transfer characteristic measuring section 10 uses random noises or MLS (maximum length sequence) noises. It outputs noise signals and sound signals in a selective manner. That is, during the measurement of the initialization, noise signals are outputted, while after the initialization, sound signals are outputted. For this purpose, the section 10 is provided with a switching function 14. This switching function 14 can be constituted in the form of software (S/W).

The signals thus outputted drive the speakers 12 through a sound output circuit. Then the signals are collected by a microphone array at the listening position. The microphone array is composed of two or more microphones which are disposed with a certain distance between them.

The transfer function calculating section 20 includes a digital signals processor (DSP), and calculates the transfer function by utilizing the mutual relationship between the collected transfer signals and the white noise of the transfer characteristic measuring section 10. Further, the section 20 compares the delays of the microphones with each other so as to calculate the direction of the speakers.

The calculated transfer function is converted into inverse characteristics, so that it would become a transfer function based on the reference speaker arrangement of the sound characteristic DB 50. Under this condition, the reference speaker arrangement is selected by the user, and generally, the reference speaker arrangement should be such that the distance between the speakers and the listening position should be 2.5 m. In the case of an A/V system, in accordance with the relationship between the speakers and the orientations which are calculated based on the size and position of the video media, the frontal speakers are corrected in view of the size and position of the video media, thereby adjusting the synchronization between audio signals and video signals.

The reproduction characteristic correcting section 30 receives as the filter coefficient the inverse characteristics which have been calculated by the transfer function calculating section 20 by means of a variable coefficient filter bank. Inputted sound signals are made to pass through a filter before being outputted from the section 30. Generally, the reproduction characteristic correcting section 30 is composed of an FIR (finite impulse response) filter, and the length of the coefficient is arbitrarily determined.

The phantom channel synthesizing section 40 generates speaker position signals for speakers which do not exist, by utilizing the frontal speakers of the speaker layout and based on the inputted sound signals. That is, there is utilized a principle that phantom sounds can be generated by utilizing an HRTF (head related transfer function) of two or more speakers. The phantom channels thus generated are combined with the frontal left and right channels of the inputted sound signals by an adder 45 so as to be inputted into the reproduction characteristic correcting section 30.

The sound characteristic DB 50 stores the characteristics such as the HRTF and the like which are needed in the transfer function calculating section 20 and the phantom channel synthesizing section 40. The characteristics such as the HRTF and the like which are needed in the transfer function calculating section 20 and the phantom channel synthesizing section 40 are transfer characteristics of the reference listening position relative to the respective reference speaker positions. These characteristics are stored in a ROM (read only memory), and therefore, a replacement can be done if needed. The respective characteristics may be composed of the lengths of different coefficients, and they transfer the characteristics such as HRTF and the like which are required by the filter of the reproduction characteristic correcting section 30 and the filter of the phantom channel synthesizing section 40.

The user interface section 60 includes the following functions. That is, the kind of the white noise is selected, and a decision is made as to whether an initialization is executed during the activation of the system. Further, a selection is made as to whether phantom channels are to be synthesized, and the channels to be synthesized are selected. Further, the channels to be measured are inputted (when there is no input, an automatic recognition is made as to the presence or absence of the transfer signals, and if needed, the distance and orientation of the real speakers can be inputted). Further, the size and position of the video media are inputted. For carrying out the above described functions, a plurality of switches are provided. Further, the user connecting section 60 includes a display part for displaying the current system status and for confirming the selected functions. This display part is composed of an LED (light emitting diode) or an LCD (liquid crystal display).

Figure 2:
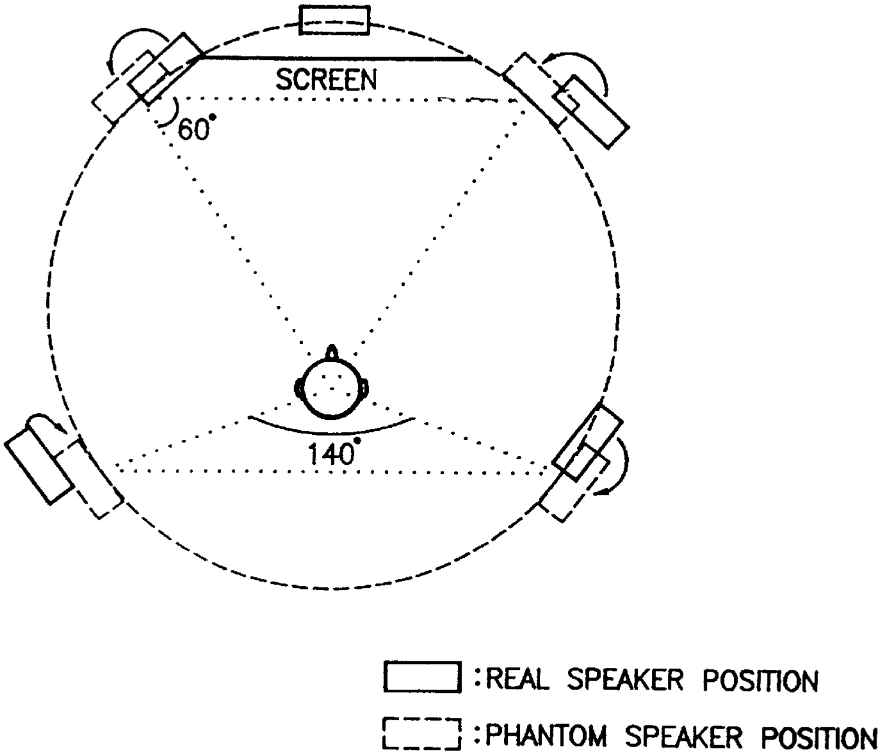
FIG. 2 is a conceptional view showing the adjustment of the positions of multi-channel speakers relative to a listener.

FIG. 2 is a conceptional view showing the adjustment of the positions of the multi-channel speakers relative to a listener. That is, there are shown the positions of the multi-channel speakers which have certain angular positions relative to the listener.

Figure 3:
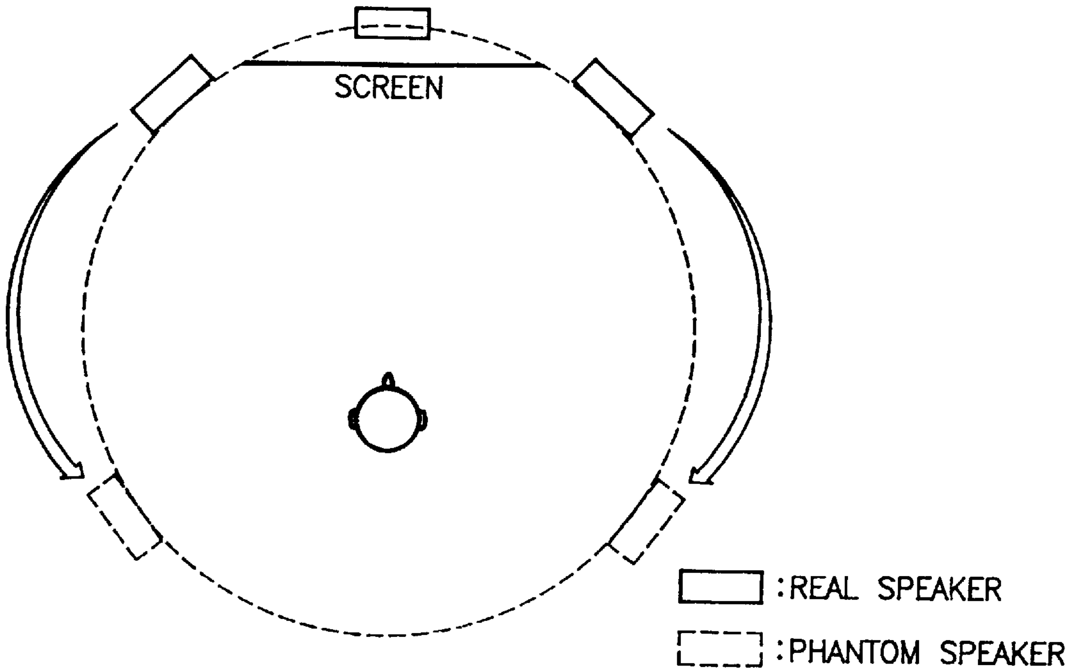
FIG. 3 is a conceptional view showing phantom channels of an audio system having a small number of channels.

FIG. 3 is a conceptional view showing phantom channels of an audio system having a small number of channels. The listener feels sounds of a large number of speakers, while there are actually a small number of speakers.

Figure 4:
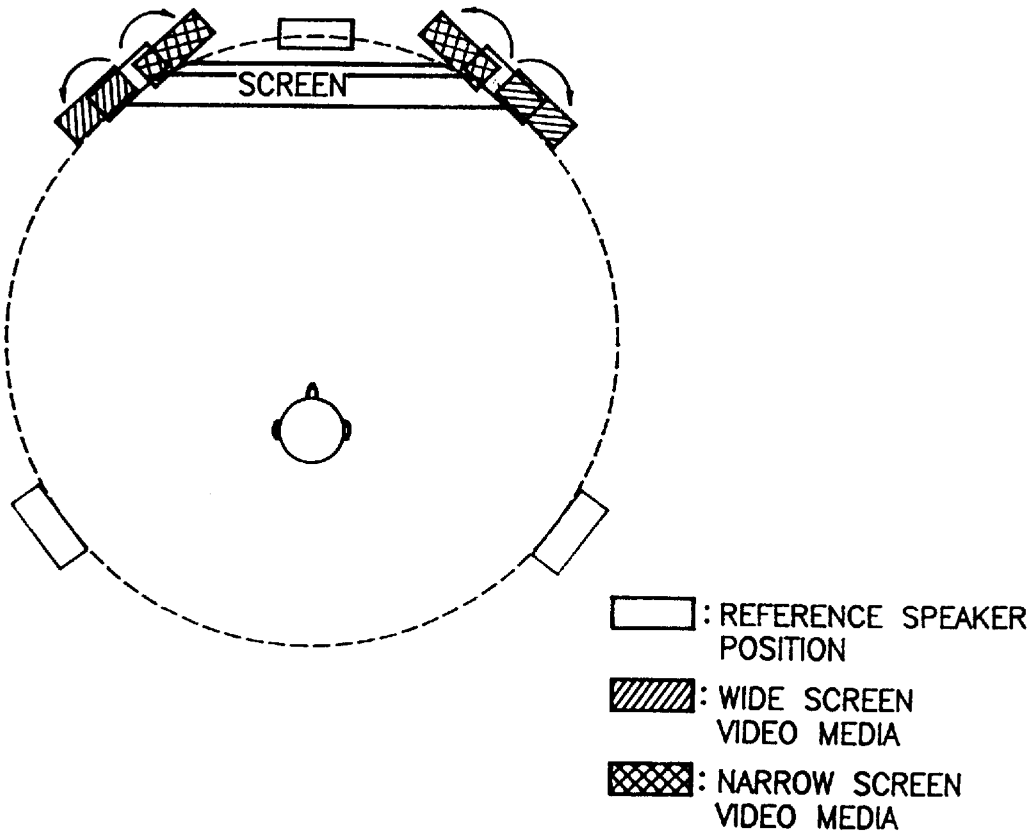
FIG. 4 is a conceptional view showing adjustments of the position and size of sound image according to the position and size of screen.

FIG. 4 is a conceptional view showing the adjustments of position and size of video media. As the size of the screen becomes smaller, the positions of the speakers are adjusted.

Figure 5:
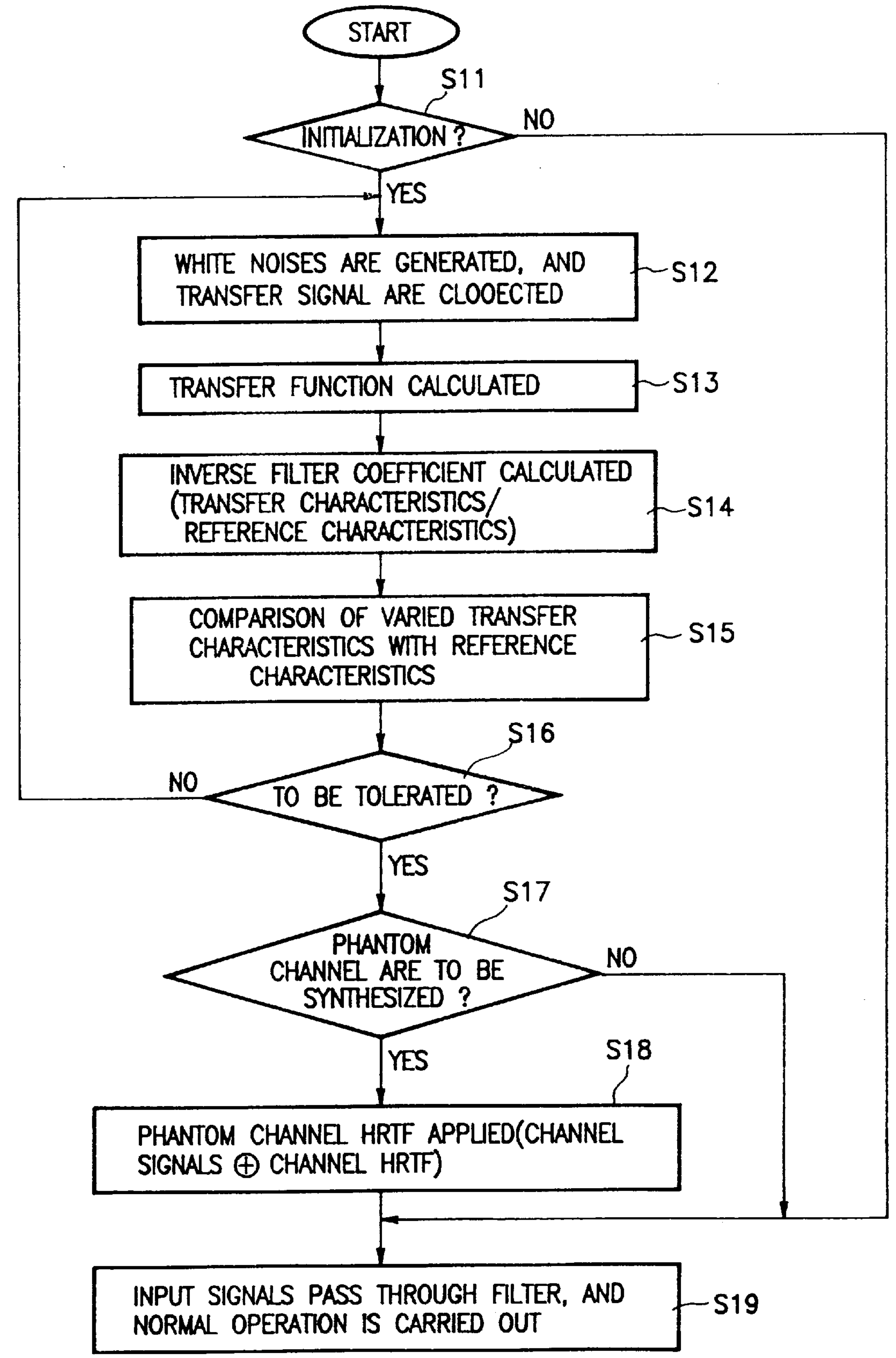
FIG. 5 is a flow chart showing the automatic adjustment of the multi-channel audio system.

FIG. 5 is a flow chart showing the automatic adjustment of the multi-channel audio system.

Referring to FIG. 5, the automatic adjusting method according to the present invention will be described.

First, the user connecting section 60 checks as to whether an initialization can be executed (S11). If it is found that an initialization cannot be carried out, a normal operation is carried out based on the existing reproduction characteristics (S19). On the other hand, if it is found that an initialization can be carried out, then white noises are generated, and the transfer signals are measured (S12). Based on this, the transfer function is calculated (S13).

Based on the transfer function thus calculated and based on the reference characteristics, an inverse filter coefficient is calculated (S14). When the signals have passed through the inverse filter to be reproduced through the speaker, a judgment is made as to whether the transfer characteristics of the listening position come within the tolerance range (S16). If they do not come within the tolerance range, the measurements, calculations and evaluations are executed again. After executing certain rounds, the result showing the smallest errors are selected as the filter coefficient. The user connecting section checks as to whether the phantom channels need to be synthesized (S17).

If the phantom channels need to be synthesized, the reference characteristics are applied in accordance with the kinds of the phantom channels. Further, the inputted sound signals are modified based on the reference characteristics, and the synthesized phantom channels are added to the frontal left and right channels (S18). Then multi-channel sounds are reproduced by means of the reproduction characteristic correcting filter based on the channels which are connected to the speakers (S19).

According to the present invention as described above, various degrading factors due to the listening environments are automatically adjusted. That is, the listening environment characteristics are measured, and the reproduction characteristics of the audio system are corrected, so that sounds can be reproduced with the optimum condition at the given listening environment, and that 2 or 3 speakers can give an effect of 5 or 6 speakers through the synthesis of phantom channels. In the case of an A/V system, the reproduction range is adjusted in accordance with the size of the screen, so that a more appealing A/V system can be realized. Thus with a given listening environment and with a given audio system, high quality sounds can be appraised, thereby meeting the desires of the general people.

What is claimed is:

1. An automatic equalizing apparatus for a multi-channel audio system comprising:

transfer characteristic measuring means for converting digital white noise signals to analog signals, said transfer characteristic measuring means comprising:

speakers through which the white noise signals are sequentially reproduced;

a microphone array for collecting respective channel transfer signals at a listening position;

transfer function calculating means for determining presence or absence of speakers and calculating transfer characteristics between respective speakers and the listening position based on the white noise signals and the transfer signals of said transfer characteristic measuring means; calculating inverse characteristics between the transfer characteristics of real speakers and reference positions of the respective speakers; and compensating the calculated transfer characteristics for size and position of a video media;

reproduction characteristic correcting means for correcting sound reproduction characteristics by forming a filter based on the calculated transfer characteristics from said transfer function calculating means;

an audio characteristic data base for storing sound characteristics of frontal left/right sides, a central portion, rear left/right sides and an upper side of a reference speaker arrangement of the audio system;

a phantom channel synthesizing means for synthesizing input signals into signals of arbitrary directions through two frontal channels based on the sound characteristics stored in said audio characteristic data base so as to reproduce sounds beyond output ranges of the speakers connected to the audio system;

user interface means for selecting an automatic adjustment of the audio system; inputting a speaker arrangement, a reference speaker arrangement and a size of the video media; and displaying a current system setup status.

2. The automatic equalizing apparatus in accordance with claim 1, wherein said transfer characteristic measuring section comprises:

white noise generating means for generating white noise signals during initialization of said speakers;

switching means for selectively outputting sound signals from said speakers or the white noise signals from said white noise generating means; and transfer signal storage means for storing transfer signals from said microphone array.

3. The automatic equalizing apparatus in accordance with claim 1, wherein the transfer characteristics calculated by said transfer function calculating means includes frequency characteristics, delay time, distances and directions.

4. The automatic equalizing apparatus in accordance with claim 1, wherein said reproduction characteristic correcting means comprises:

an finite impulse response filter having a filter coefficient based on the inverse characteristics of said transfer function calculating means.

5. A method for automatically equalizing a multi-channel audio system comprising the steps of:

(a) determining using a user interface means that initialization needs to be performed;

(b) generating white noise signals;

(c) measuring transfer signals;

(d) calculating a transfer function based on the generated white noise signals and the transfer signals;

(e) calculating an inverse filter coefficient based on the calculated transfer function;

(f) after signals, which represent sound signals from a sound input, have been passed through an inverse filter and reproduced through speakers, determining whether a transfer characteristic of a listening position falls within a tolerance range and repeating steps (e) through (f) if the transfer characteristic of the listening position does not fall within the tolerance range and steps (e) through (f) have not been performed more than a predetermined number of rounds; and, if the predetermined number of rounds is exceeded selecting a smallest error as a filter coefficient; and (g) determining using the user interface means that a type of phantom channels needs to be synthesized, the applying reference characteristics in accordance with the type of phantom channels and modifying inputted sound signals based on the reference characteristics of the type of phantom channels so as to synthesize phantom signals; adding the synthesized phantom signals to frontal left and right channels; and reproducing multi-channel sounds through speaker-connected channels using a reproduction characteristic correcting means.

* * * * *